United States Patent
Kim

(10) Patent No.: US 12,349,490 B2
(45) Date of Patent: Jul. 1, 2025

(54) SENSOR PACKAGE AND METHOD OF MANUFACTURING THE SAME

(71) Applicant: Samsung Electronics Co., Ltd., Suwon-si (KR)

(72) Inventor: Sunjae Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 539 days.

(21) Appl. No.: 17/667,993

(22) Filed: Feb. 9, 2022

(65) Prior Publication Data

US 2022/0406831 A1 Dec. 22, 2022

(30) Foreign Application Priority Data

Jun. 17, 2021 (KR) ........................ 10-2021-0078754

(51) Int. Cl.
   *H10F 39/00* (2025.01)
(52) U.S. Cl.
   CPC ....... *H10F 39/8063* (2025.01); *H10F 39/024* (2025.01); *H10F 39/8053* (2025.01); *H10F 39/8057* (2025.01); *H10F 39/811* (2025.01)
(58) Field of Classification Search
   None
   See application file for complete search history.

(56) References Cited

U.S. PATENT DOCUMENTS

| 7,446,384 B2 | 11/2008 | Paik et al. |
| 8,563,350 B2 | 10/2013 | Tu et al. |
| 9,502,455 B2 | 11/2016 | Akahoshi et al. |

(Continued)

FOREIGN PATENT DOCUMENTS

| KR | 1020070039679 A | 4/2007 |
| KR | 100769722 B1 | 10/2007 |

(Continued)

*Primary Examiner* — Jack S Chen
(74) *Attorney, Agent, or Firm* — Muir Patent Law, PLLC

(57) ABSTRACT

A sensor package includes: an image sensor including a body layer having an upper surface and a lower surface, opposite to the upper surface, a pixel layer disposed on the upper surface, a microlens array disposed on the pixel layer, a connection terminal disposed on the lower surface, and a through-via extending between the upper surface and the lower surface and electrically connected to the connection terminal; a support structure disposed on the pixel layer and having an opening in which the microlens array is accommodated; an optical filter disposed on the support structure and having a first region, overlapping the image sensor in a first direction, and a second region extending from the first region in a second direction, perpendicular to the first direction, and not overlapping the image sensor in the first direction; an encapsulant surrounding a side surface of the image sensor and a side surface of the support structure and covering and contacting a portion of a lower surface of the second region; and a connection bump disposed on the connection terminal of the image sensor. In the second direction, a first distance along a boundary where the lower surface of the optical filter at the second region contacts the encapsulant is greater than a second distance of a lower surface of the optical filter at the second region exposed from the encapsulant.

20 Claims, 18 Drawing Sheets

(56) References Cited

U.S. PATENT DOCUMENTS

| | | |
|---|---|---|
| 10,714,402 B2 | 7/2020 | Shigeta et al. |
| 2006/0171698 A1 | 8/2006 | Ryu et al. |
| 2007/0080418 A1 | 4/2007 | Ryu |
| 2008/0083965 A1 | 4/2008 | Ryu et al. |
| 2022/0406831 A1* | 12/2022 | Kim .................. H01L 27/14685 |

FOREIGN PATENT DOCUMENTS

| | | |
|---|---|---|
| KR | 100838288 B1 | 6/2008 |
| KR | 1020210021172 A | 2/2017 |
| KR | 10201700646424 A | 6/2017 |

\* cited by examiner

SENSOR PACKAGE AND METHOD OF MANUFACTURING THE SAME

CROSS-REFERENCE TO RELATED APPLICATION(S)

This application claims the benefit of priority to Korean Patent Application No. 10-2021-0078754 filed on Jun. 17, 2021 in the Korean Intellectual Property Office, the disclosure of which is incorporated herein by reference in its entirety.

BACKGROUND

The present disclosure relates to a sensor package and a method of manufacturing the same.

An image sensor module, including an image sensor package, may be mounted in an electronic device such as a digital camera, a camera phone, or the like. An optical filter may be packaged together in the image sensor package to improve sensitivity of the image sensor. The optical filter may be fixed to the image sensor by an encapsulant for a package. In this case, a structure for effectively coupling the encapsulant and the optical filter to each other is desirable to secure reliability of the image sensor package.

SUMMARY

Example embodiments provide a sensor package having improved reliability.

According to an example embodiment, a sensor package includes an image sensor, a support structure, an optical filter, an encapsulant, and a connection bump. The image sensor includes a body layer having an upper surface and a lower surface, the lower surface being disposed to oppose the upper surface, a pixel layer disposed on the upper surface, a microlens array disposed on the pixel layer, a connection terminal disposed on the lower surface, and a through-via extending between the upper surface and the lower surface and electrically connected to the connection terminal. The support structure is disposed on the pixel layer and has an opening in which the microlens array is accommodated. The optical filter is disposed on the support structure and has a first region, overlapping the image sensor in a first direction, and a second region extending from the first region in a second direction, perpendicular to the first direction, and not overlapping the image sensor in the first direction. The encapsulant surrounds a side surface of the image sensor and a side surface of the support structure and covers and contacts a portion of a lower surface of the second region. The connection bump is disposed on the connection terminal of the image sensor. In the second direction, a first distance along a boundary where the lower surface of the optical filter at the second region contacts the encapsulant is greater than a second distance of a lower surface of the optical filter at the second region exposed from the encapsulant.

According to an example embodiment, which may be the same as or different from the aforementioned embodiment, a sensor package includes an image sensor, an optical filter, a support structure, and an encapsulant. The image sensor includes a body layer having an upper surface and a lower surface, the lower surface being disposed to oppose the upper surface, a pixel layer disposed on the upper surface, a microlens array disposed on the pixel layer, a connection terminal disposed on the lower surface, and a through-via extending between the upper surface and the lower surface and electrically connected to the connection terminal. The optical filter is disposed on the pixel layer and has a first region, overlapping the image sensor in a first direction, and a second region extending from the first region in a second direction, perpendicular to the first direction, and not overlapping the image sensor in the first direction. The support structure is disposed between the image sensor and the optical filter, and the encapsulant extends from a side surface of the image sensor to be inclined to a lower surface of the optical filter and cover at least a portion of each of the side surface of the image sensor and a lower surface of the optical filer. The optical filter is electrically insulated from the image sensor.

According to an example embodiment, which may be the same as or different from the aforementioned embodiments a sensor package includes an image sensor, an optical filter, and an encapsulant. The image sensor has an upper surface, on which a microlens array is disposed, and a lower surface on which a connection terminal is disposed. The optical filter is disposed on the upper surface of the image sensor and having a first region, overlapping the image sensor in a first direction, and a second region extending from the first region in a second direction, perpendicular to the first direction, and not overlapping the image sensor in the first direction. The encapsulant covers a side surface of the image sensor and a lower surface of the optical filter at second region. A ratio of a contact distance along a boundary between the encapsulant and the lower surface of the optical filter at the second region in the second direction to a maximum width of the image sensor in the second direction is about 0.04:1 or more.

According to an example embodiment, a method of manufacturing a sensor package includes: preparing an optical filter substrate, having a first surface and a second surface disposed to oppose the first surface, to which a light blocking mask is attached to define a plurality of light incident areas on the first surface; forming a plurality of support structures, having an opening corresponding to one of the plurality of light incident areas, on the second surface of the optical filter substrate; disposing the image sensor on each of the plurality of support structures to accommodate a microlens array of an image sensor in the opening; applying an encapsulant resin to a periphery of the image sensor to form an encapsulant surrounding a side surface of the image sensor and a side surface of each of the plurality of support structures and in contact with at least a portion of the second surface of the optical filter substrate; and cutting the optical filter substrate along the second surface exposed from the encapsulant.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1A:
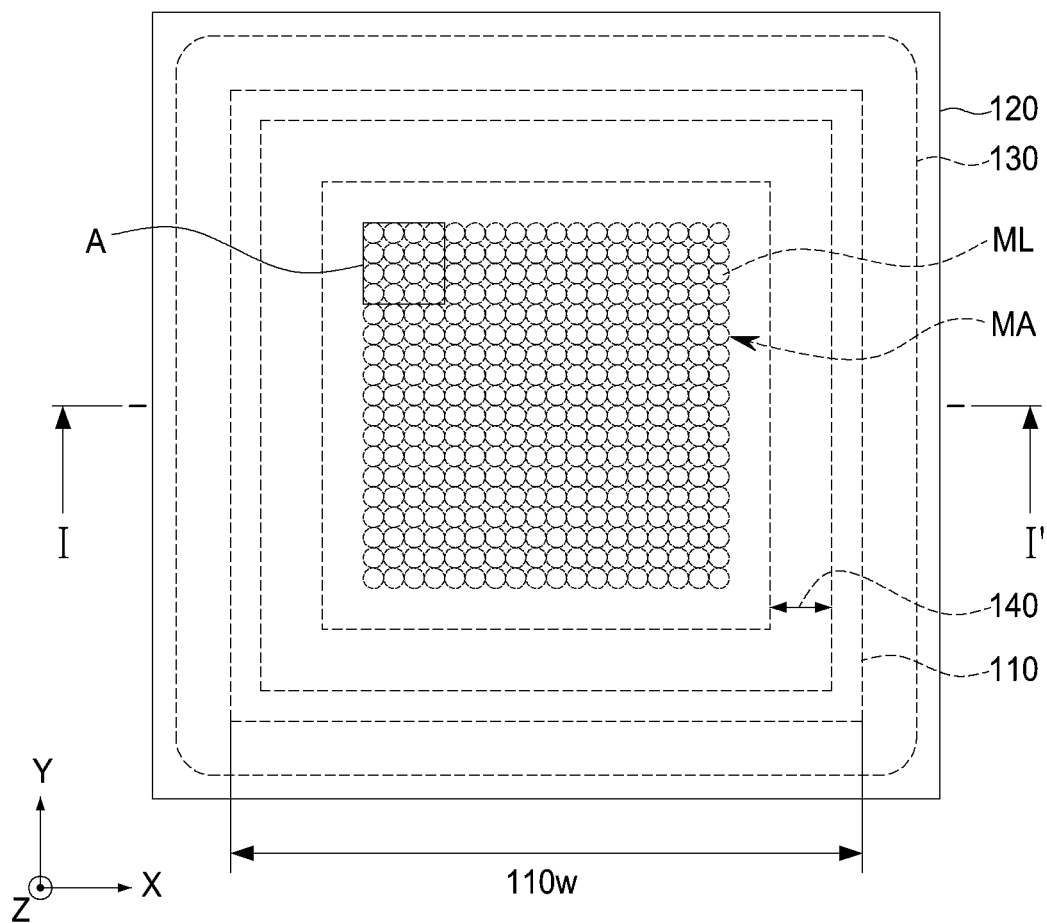
FIG. 1A is a plan view of a sensor package according to an example embodiment.
Figure 1B:
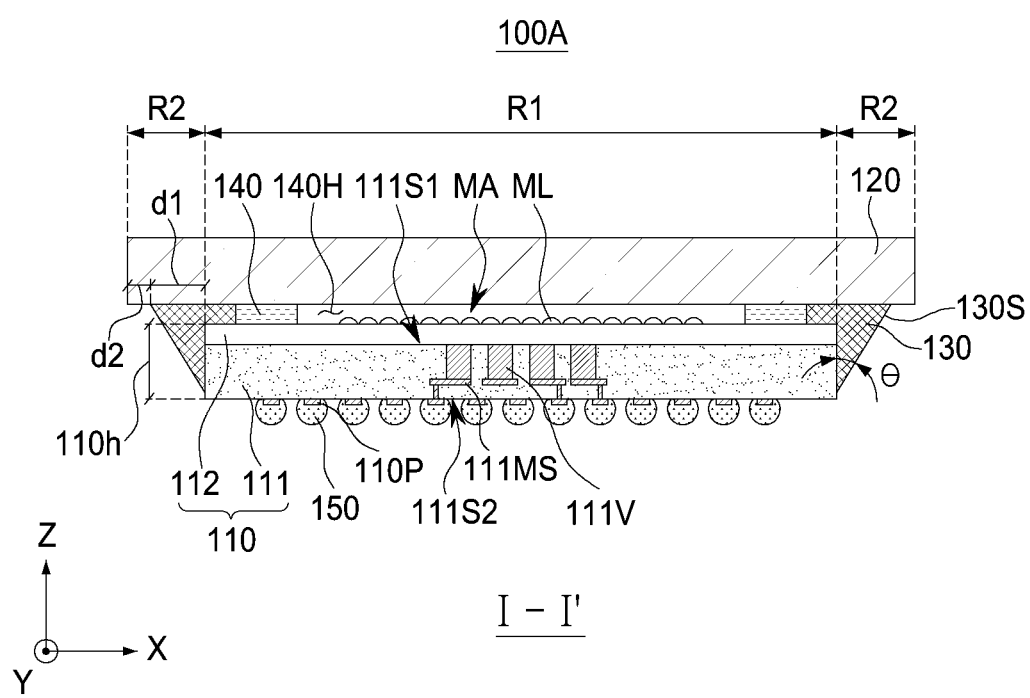
FIG. 1B is a cross-sectional view taken along line I-I' of FIG. 1A.

FIG. 1A is a plan view of a sensor package 100A according to an example embodiment, and FIG. 1B is a cross-sectional view taken along line I-I' of FIG. 1A.

Referring to FIGS. 1A and 1B, a sensor package 100A, also described as an image sensor package, according to an example embodiment may include an image sensor 110, an optical filter 120, and an encapsulant 130. The sensor package 100A according to an example embodiment may further include a support structure 140 and/or a connection bump 150 (e.g., a plurality of connection bumps). According to example embodiments, a strip-level package process using the optical filter 120 as a base substrate may be introduced, so that a contact area between the encapsulant 130 and the optical filter 120 may be sufficiently secured to improve reliability of a package, and stability of a dicing process may be secured to increase process yield. The strip-level package process will be described later with reference to FIGS. 7A to 7E.

The image sensor 110, also described as an image sensor chip, may include a body layer 111 having an upper surface 111S1 and a lower surface 111S2 disposed to oppose the upper surface 111S1, a pixel layer 112 disposed on the upper surface 111S1, a microlens array MA or a plurality of microlenses ML disposed on the upper surface 111S1, a connection terminal 110P (e.g., plurality of connection terminals) disposed on the lower surface 111S2, and a through-via 111V extending between the upper surface 111S1 and the lower surface 111S2 and electrically connected to the connection terminal 110P. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The through-via 111V may be electrically connected to the connection terminal 110P through an interconnection structure 111MS. The connection terminal 110P may be, for example, a pad or other conductive terminal formed at a surface of a body of the image sensor 110. The interconnection structure 111MS may be a conductive connection structure including at least one layer of contact vias (e.g., vertically extending contact vias) and one layer of interconnection patterns (e.g., horizontally extending conductive patterns), but is not limited to a specific form. The through-vias 111V may be, for example, through-substrate vias such as through-silicon vias. The image sensor 110 may include a complementary metal oxide semiconductor (CMOS) image sensor, but an example of the image sensor is not limited thereto. According to an example embodiment, the image sensor 110 may further include a logic layer (not illustrated) and/or a storage layer (not illustrated) stacked below the pixel layer 112. The storage layer (not illustrated) may store image data captured by the pixel layer 112 and processed by the logic layer (not illustrated). For example, the storage layer (not illustrated) may include a volatile memory device such as a dynamic RAM (DRAM), a static RAM (SRAM), or the like, or a nonvolatile memory device such as a phase change RAM (PRAM), a magnetic RAM (MRAM), a resistive RAM (RRAM), a flash memory, or the like. The type and structure of the image sensor 110 applicable to example embodiments are not limited. However, as an example embodiment, a structure of a CMOS image sensor applicable to the present disclosure will be described later with reference to FIGS. 2A to 2D.

The optical filter 120 may be disposed on the pixel layer 112 or the microlens array MA of the image sensor 110, and may have a first region R1 overlapping the image sensor 110 in a first direction (a Z-axis direction, for example, a vertical direction, from a plan view) and a second region R2 extending from the first region R1 in a second direction (an X-axis and Y-axis direction, for example, a horizontal direction), perpendicular to the first direction (the Z-axis direction). The optical filter 120 may be attached to the support structure 140 by an adhesive or the like, but example embodiments are not limited thereto. The optical filter 120 may be fixed onto the support structure 140 by the encapsulant 130. The optical filter 120 may be a substrate transparent to light in a specific wavelength band. For example, the optical filter 120 may be a blue glass filter configured to filter infrared or near-infrared rays and to transmit light in a visible ray region. In an example embodiment, the optical filter 120 may be an absorptive filter configured to absorb infrared and/or near-infrared rays, and may be electrically insulated from the image sensor 110 (e.g., because there is an insulative layer therebetween and no continuous electrically conductive path therebetween). According to example embodiments, a coating film (for example, an infrared (IR) coating film) (not illustrated) may be formed on a surface of the optical filter 120 to improve optical characteristics. According to the present disclosure, the optical filter 120 having a larger planar area than the image sensor 110 may be disposed on the image sensor to sufficiently secure a contact area between the encapsulant 130 and the image sensor 110 and to improve reliability of the sensor package 100A. For example, as described above, the optical filter 120 may have the second region R2 which does not overlap the image sensor 110, and a contact area between the encapsulant 130 and the optical filter 120 may be secured through the second region R2 (though part of the contact area between the encapsulant 130 and the optical filter 120 may be in the first region R1).

The encapsulant 130 may obliquely extend from a side surface of the image sensor 110 and to a lower surface of the optical filter 120 to cover at least a portion of each of the side surface of the image sensor 110 and the lower surface of the optical filter 120. The encapsulant 130 may be formed to surround the side surface of the image sensor 110 and a side surface of the support structure 140 and to cover a portion of a lower surface of the second region R2. For example, the encapsulant 130 may be formed to surround four side surfaces of the image sensor 110 and four outer side surfaces of the support structure 140. The encapsulant 130 may include or be formed of an adhesive insulating material. The encapsulant 130 may include or be formed of, for example, a thermosetting resin such as an epoxy resin, a thermoplastic resin such as polyimide, or a resin in which an inorganic filler and/or a glass fiber is impregnated.

In the present disclosure, the contact area between the optical filter 120 and the encapsulant 130 may be secured through the second region R2 extending from the first region R1 in the second direction (the X-axis and Y-axis direction). The contact area between the optical filter 120 and the encapsulant 130 may be determined by various conditions (for example, a width of the image sensor, a height of the image sensor, and the like). Hereinafter, a "contact distance d1" between the second region R2 of the optical filter 120 and the encapsulant 130 and at which the second region R2 or the optical filter 120 contacts the encapsulant 130 will be understood to be a shortest distance in the horizontal direction along a boundary between the second region R2 of the optical filter 120 and the encapsulant 130. It can be understood as the shortest contact distance in a horizontal direction (the X-axis or Y-axis direction). The contact distance d1 may also be described as a contact distance along a boundary between the optical filter 120 and the encapsulant 130 (e.g., in a horizontal direction). For example, the contact distance d1 may be measured in the X-axis direction.

In an example embodiment, a contact distance d1 between a lower surface of the encapsulant 130 and the second region R2 in the second direction (the X-axis and Y-axis direction) may have a ratio of about 0.04:1 or more compared to a maximum width 110w of the image sensor in the second direction (the X-axis and Y-axis direction). For example, in a first direction (e.g., X direction) a ratio of the contact distance d1 between the encapsulant 130 and the lower surface of the second region R2 at one side of the sensor package 110A to the maximum width 110w of the image sensor 110 may have a value in a range of about 0.04:1 to about 0.08:1, about 0.04:1 to about 0.07:1, about 0.04:1 to about 0.06:1, or about 0.04:1 to about 0.05:1. When the ratio of the contact distance d1 to the maximum width 110w is less than about 0.04:1, the contact area between the optical filter 120 and the encapsulant 130 is not sufficiently secured, so that a reliability improvement effect may be insignificant. When the ratio of the contact distance d1 to the maximum width 110w is about 0.1:1 or more, the number of image sensors 110 disposed on a substrate (see 120P of FIG. 7A) of the optical filter 120 may be excessively decreased, resulting in reduced yield. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range In an example embodiment, the contact distance d1 between the encapsulant 130 and the lower surface of the second region R2 in the second direction (the X-axis and Y-axis direction) may have a ratio of about 2:1 or more to a thickness 110h of the image sensor 110 in the first direction (the Z-axis direction). For example, a ratio between the contact distance d1 at one side of the sensor package 100A and the thickness 110h of the image sensor 110 may have a value in a range of about 2:1 to about 5:1, about 3:1 to about 5:1, or about 3:1 to about 4:1. When the ratio of the contact distance d1 to the thickness 110h of the image sensor 110 is less than about 2:1, a reliability improvement effect may be insignificant. When the ratio of the contact distance d1 to the thickness 110h of the image sensor 110 is greater than about 4:1, the number of image sensors disposed on the substrate (see 120P of FIG. 7A) of the optical filter 120 may be excessively reduced, resulting in reduced yield. As an example, when the thickness 110h of the image sensor 110 is about 100 μm, the contact distance d1 may be about 300 μm or more.

In an example embodiment, in the second direction (the X-axis and Y-axis direction), a contact distance (or a first distance) d1 of a lower surface of the second region R2 in contact with the encapsulant 130 may be greater than a second distance d2 of the lower surface of the second region R2 exposed from the encapsulant 130 and coplanar with the lower surface of the second region R2 in contact with the encapsulant 130. For example, the encapsulant 130 may be formed to be spaced apart from a corner of the optical filter 120 by the predetermined distance d2, and a side surface of the optical filter 120 may not be in contact with the encapsulant 130. The second distance or the predetermined distance d2 may be determined during a dicing process (see FIG. 7E) in consideration of a minimum separation distance for preventing the encapsulant 130 from being peeled off and the number of sensor packages removed from the substrate of the optical filter 120. As shown in FIG. 1B and other figures, in various embodiments, there are no components on the lower surface of the optical filter between a location where the outer sidewall of the encapsulant 130 meets the lower surface of the optical filter 120, and an edge, or corner of the optical filter 120. For example, the second distance or predetermined distance d2 may be within a range of about 3 μm to about 18 μm, about 5 μm to about 15 μm, or about 8 μm to about 12 μm. When the second distance or the predetermined distance d2 is greater than about 18 μm, the number of image sensors 110 disposed on the substrate (see 120P of FIG. 7A) of the optical filter 120 may be excessively decreased, resulting in reduced yield. When the second distance or the predetermined distance d2 is less than about 3 μm, there may be an increasing probability that the encapsulant 130 is peeled off during a dicing process.

In an example embodiment, the encapsulant 130 may have a shape in which at least a portion of the side surface 130S thereof extends at a predetermined angle θ with respect to the side surface of the image sensor 110. The encapsulant 130 may have a shape extending from the side surface of the image sensor 110 to the lower surface of the second region R2 of the optical filter 120. The side surface 130S of the encapsulant 130 may extend at an angle, with respect to the side surface of the image sensor 110, ranging from greater than about zero degrees to less than about 90 degrees, for example, from about 10 degrees to about 80 degrees, about 20 degrees to about 80 degrees, about 30 degrees to about 70, or the like. This is a structure resulting from a strip-level process using the substrate (see 120P of FIG. 7A) of the optical filter 120 as a base substrate, according to some embodiments. Since the encapsulant 130 is formed to expose a corner portion of the second region R2, the encapsulant 130 may be prevented from being peeled off in the dicing process (see FIG. 7E).

The support structure 140 may be disposed between the image sensor 110 and the optical filter 120, and may support the optical filter 120 on the image sensor 110. The support structure 140 may be disposed on the pixel layer 112 of the image sensor 110 and may have an opening 140H in which the microlens array MA is accommodated. The support structure 140 may be formed of or may include a polymer material, for example, an epoxy-based resin, a siloxane-based resin, or the like, but an example of the polymer material is not limited thereto. The support structure 140 may be formed to surround a periphery of the microlens array MA, and thus, may block the microlens array MA from the encapsulant 130. For example, the support structure 140 may provide a physical barrier between the microlens array MA and the encapsulant 130, for example, so that no materials can reach the microlens array MA from the encapsulant 130 or from outside the encapsulant 130.

The connection bumps 150 may be disposed on the connection terminal 110P of the image sensor 110, and may provide an electrical connection path through which a pixel signal generated in the pixel layer 112 is transmitted to an external entity. The connection bumps 150 may be formed of a conductive material, for example, nickel (Ni), copper (Cu), palladium (Pd), platinum (Pt), gold (Au), tin (Sn), indium (In), bismuth (Bi), antimony (Sb), copper (Cu), silver (Ag), zinc (Zn), lead (Pb), and/or alloys thereof. The connection bumps 150 may have a pin, lead, or ball shape.

Figure 2A:
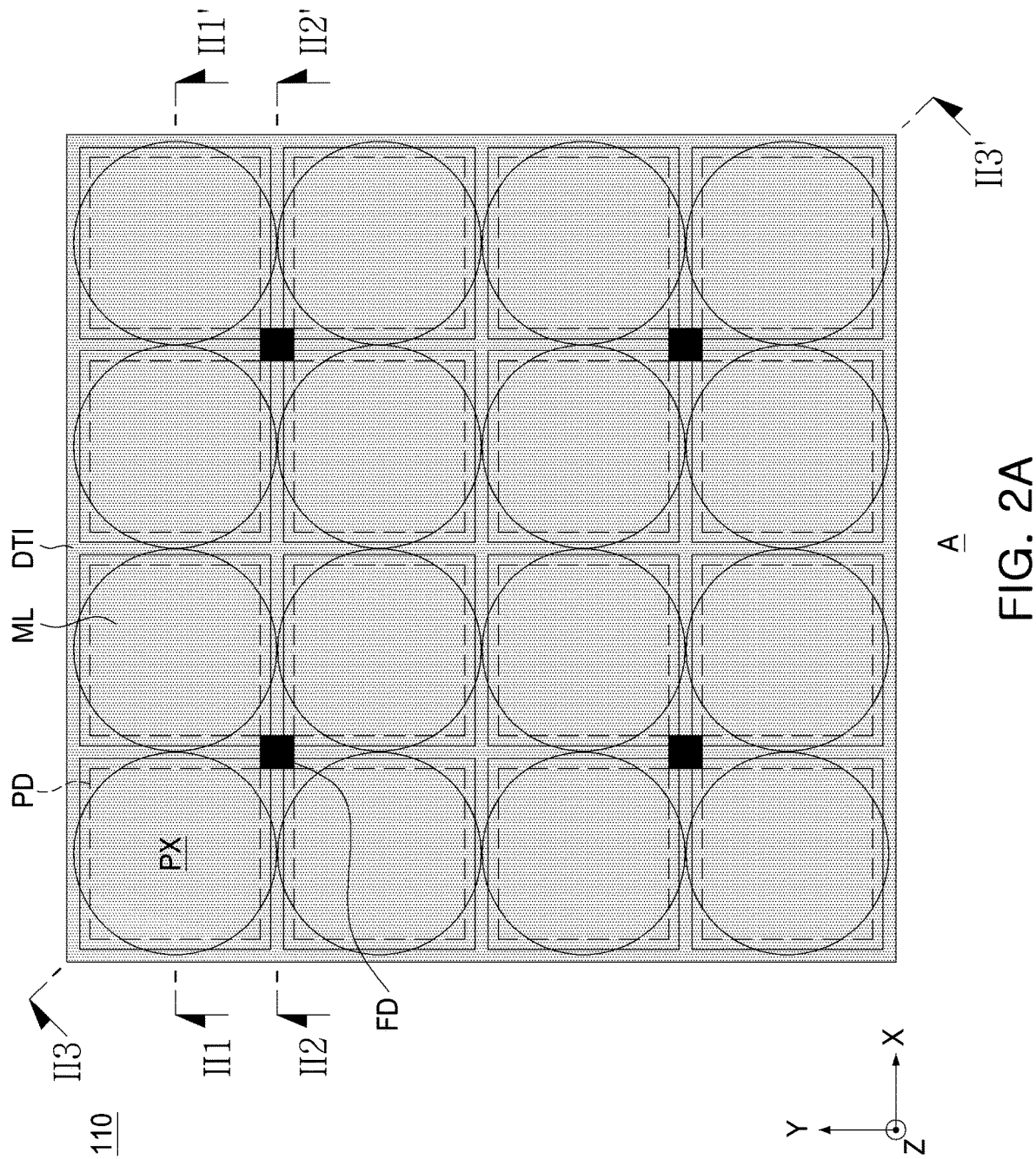
FIGS. 2A to 2D are plan views and cross-sectional views of an image sensor applicable to example embodiments.

FIGS. 2A to 2D are plan views and cross-sectional views of an image sensor applicable to example embodiments. FIG. 2A is a plan view illustrating some pixels PX of the image sensor 110 corresponding to region "A" of FIG. 1A, and FIGS. 2B to 2D are cross-sectional views taken along lines II1-II1', II2-II2', and II3-II3' of FIG. 2A, respectively.

Referring to FIG. 2A, an image sensor 110 according to an example embodiment may include a plurality of unit pixels PX exposed to an upper surface thereof. Among the plurality of unit pixels PX, at least some pixels PX may be configured to share a floating diffusion region FD. The plurality of unit pixels PX may include a color filter (see 12 of FIG. 2B) having a predetermined color. In the color filter, the plurality unit pixels PX may be disposed in the order of green, red, blue, and green pixels, respectively corresponding thereto. However, according to some embodiments, the plurality of unit pixels PX may be disposed in the order of green, red, blue, and green pixels, respectively corresponding to a plurality of unit pixels PX constituting a group. As an example, the plurality of unit pixels PX illustrated in FIG. 2A may be understood to constitute a single pixel group.

Each of the plurality of unit pixels PX may include a photodiode PD generating an electrical signal in response to external light incident thereon. The plurality of unit pixels PX may include a microlens ML corresponding to each of the plurality of unit pixels PX. As an example, a center of the microlens ML may overlap the photodiode PD in a first direction (a Z-axis direction).

The plurality of unit pixels PX may be defined by a device isolation layer DTI. In a region adjacent to the floating diffusion region FD, the device isolation layer DTI may be separated in a second direction (for example, an X-axis direction), perpendicular to the first direction, and a third direction (for example, a Y-axis direction), perpendicular to the first direction and the second direction. The device isolation layer DTI may allow charges, generated in the photodiode PD included in each of the plurality of unit pixels PX, to be accumulated in a corresponding photodiode PD. Ordinal numbers such as "first," "second," "third," etc. may be used simply as labels of certain elements, steps, directions, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 2B:
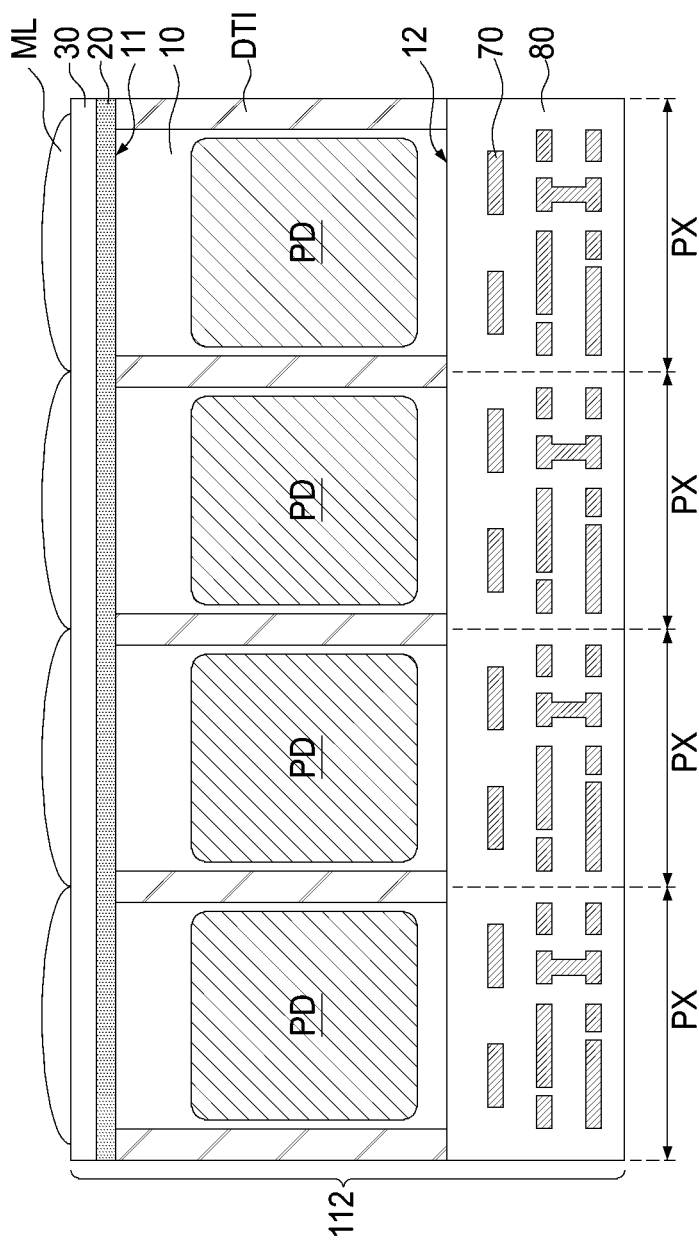
Figure 2C:
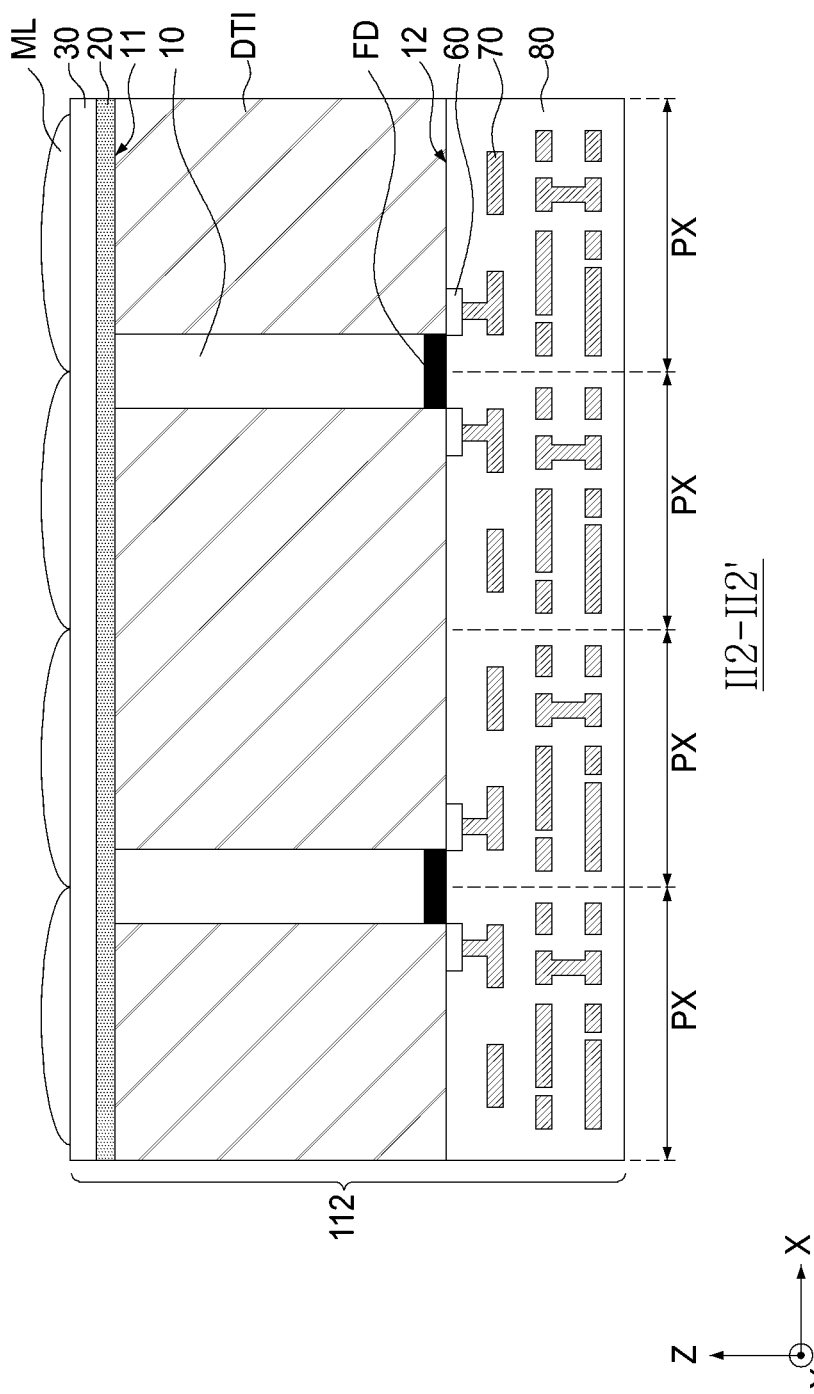
Figure 2D:
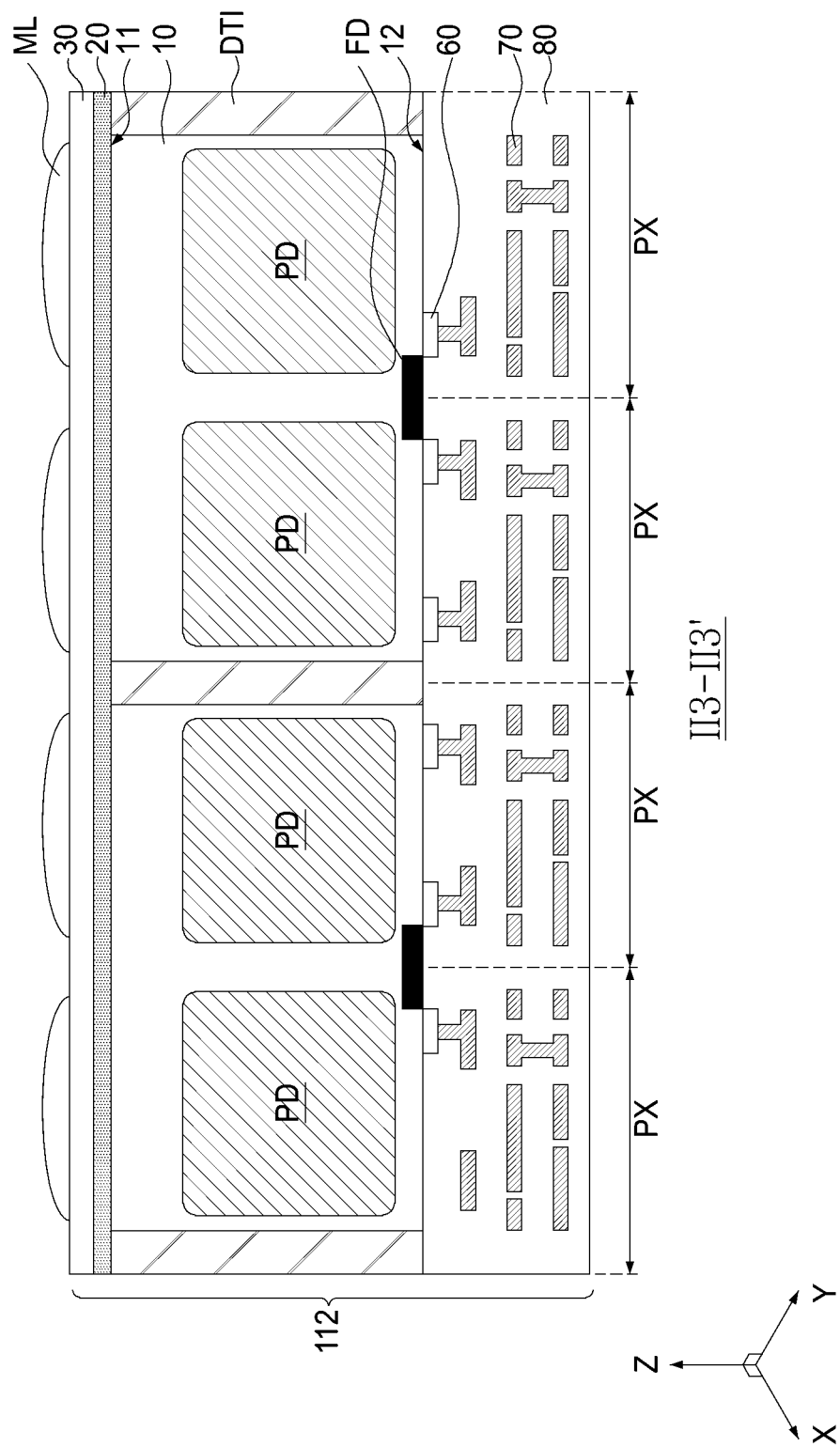

Referring to FIGS. 2B to 2D, an image sensor according to an example embodiment may include a substrate 10, including a first surface 11 and a second surface 12 facing away from each other, and a device isolation layer DTI disposed between a plurality of unit pixels PX in the substrate 10. As an example, the plurality of unit pixels PX may be arranged in a direction, parallel to the first surface 11. Each of the plurality of unit pixels PX may include a photodiode PD disposed in the substrate 10. FIGS. 2B to 2D may be understood to illustrate a portion, corresponding to the pixel layer 112 illustrated in 1B, in detail.

A color filter 20, a light transmission layer 30, and a microlens ML may be sequentially disposed on the first surface 11 of the substrate 10. For example, the color filter 20 may have different colors, for example, green, red, and blue colors, respectively corresponding to the plurality of unit pixels PX, and the microlens ML may be disposed in one-to-one correspondence with each of the plurality of unit pixels PX. However, this is only an example embodiment, and an image sensor applicable to the present disclosure is not limited thereto. Light, incident through the microlens ML, may be incident on a photodiode included in each of the plurality of unit pixels PX. As described above, the resolution of a generated image may be improved using the plurality of unit pixels PX, sharing the floating diffusion region FD, and the microlens ML corresponding to each of the plurality of unit pixels PX.

A pixel circuit may be disposed below the photodiode PD. As an example, the pixel circuit may include a plurality of devices 60, interconnection patterns 70 connected to the plurality of devices 60, an insulating layer 80 covering the plurality of devices 60 and the interconnection patterns 70, and the like, and may be disposed on a second side 12 of the substrate 10. The pixel circuit may operate to obtain a pixel signal from the plurality of unit pixels PX. The pixel circuit may include a floating diffusion region FD. As an example, a plurality of unit pixels PX, disposed to be adjacent to each other, may share a floating diffusion region FD disposed therebetween. However, the floating diffusion region FD may not be limited to that illustrated in FIGS. 2C and 2D. As an example, a location, an area, and the like, of the floating diffusion region FD may vary according to example embodiments. A plurality of devices 60, adjacent to the floating diffusion region FD, may be first to fourth transmission transistors. A gate of each of the first to fourth transfer transistors may have a vertical structure in which at least a region is buried in the substrate 10.

The plurality of unit pixels PX may be separated from each other by the device isolation layer DTI, as illustrated in FIG. 2B. The device isolation layer DTI may be separated in second and third directions, as illustrated in FIGS. 2C and 2D, and a floating diffusion region FD may be disposed in a region in which the device isolation layer DTI is separated. The device isolation layer DTI may be separated to such an extent that charges do not overflow between adjacent photodiodes.

While examples of an image sensor applicable to the present disclosure have been described with reference to FIGS. 2A to 2D, example embodiments are not limited thereto. Referring to the above description, the pixel layer 112 of the image sensor 110 illustrated in FIG. 1B may include a photodiode PD, a plurality of devices 60, a pixel circuit, and the like. For example, the pixel layer 112 may include a plurality of unit pixels PX including a plurality of photodiodes PD disposed below a microlens array, a plurality of devices 60 disposed below the photodiodes PD, and interconnection patterns 70 connected to the plurality of devices 60. In addition, a through-via 111V may be electrically connected to the interconnection patterns 70 and may be configured to receive pixel signals from the plurality of unit pixels PX.

Figure 3:
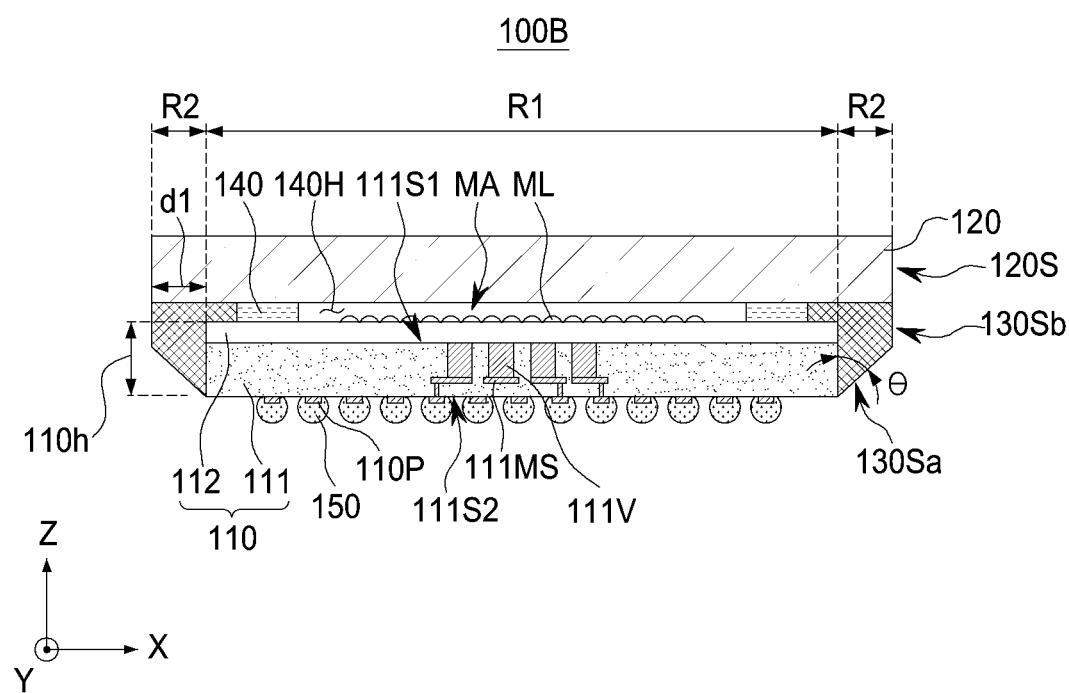
FIG. 3 is a cross-sectional view of a sensor package according to an example embodiment.

FIG. 3 is a cross-sectional view of a sensor package 100B according to an example embodiment.

Referring to FIG. 3, the sensor package 100B according to an example embodiment may have the same features as similar features to those of the sensor package 100A illustrated in FIGS. 1A and 1B, except that one side surface of an encapsulant 130 and a side surface of an optical filter 120 are coplanar with each other. For example, in the present embodiment, the encapsulant 130 may have a first side surface 130Sa, extending from a side surface of an image sensor 110 at a predetermined angle θ, and a second side surface 130Sb bent from the first side surface 130Sa to extend to the side surface 120S of the optical filter 120. In this case, the second side surface 130Sb of the encapsulant 130 and a side surface 120S of the optical filter 120 may be cut surfaces exposed by a dicing process. In the present embodiment, a second region R2 of the optical filter 120 may not be exposed from the encapsulant 130, but a thickness of the encapsulant 130 covering the side surface of the image sensor may be secured to improve reliability. In addition, as described with reference to FIGS. 1A and 1B, a contact distance d1 between a lower surface of the encapsulant 130 and the second region R2 in a second direction (an X-axis and Y-axis direction) may have a ratio of about 2 or more to a thickness 110h of the image sensor 110 in a first direction (a Z-axis direction). For example, the contact distance d1 may have a ratio, to the thickness 110h of the image sensor 110, ranging from about 2:1 to about 5:1, from about 3:1 to about 5:1, or from about 3:1 to about 4:1. As an example, when the thickness 110h of the image sensor 110 is about 100 μm, the contact distance d1 may be about 300 μm or more. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Figure 4:
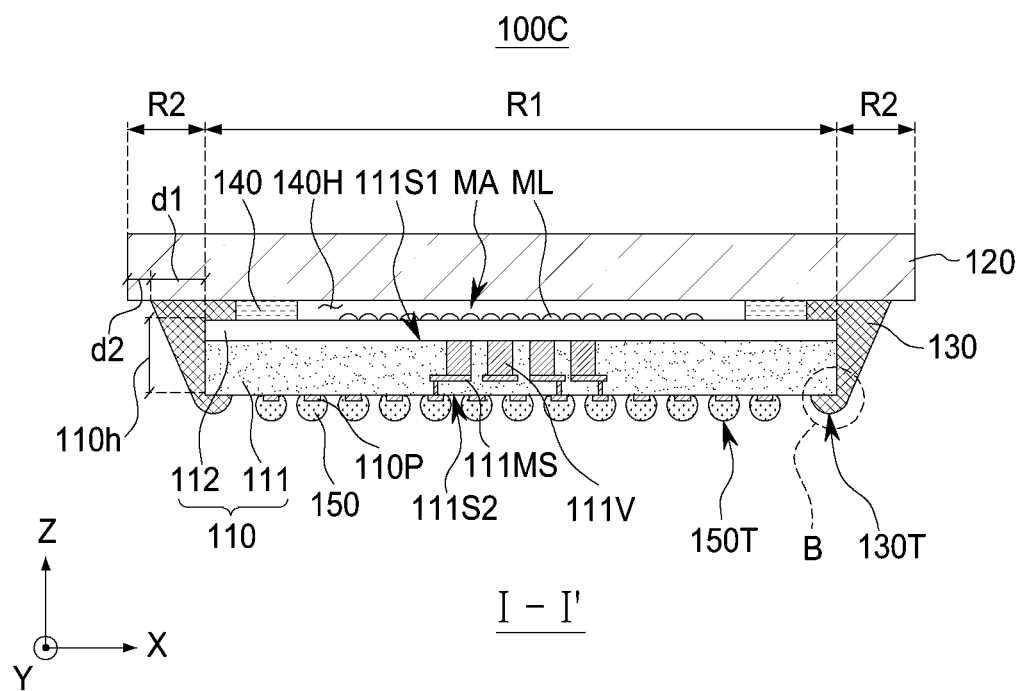
FIG. 4 is a cross-sectional view of a sensor package according to an example embodiment.

FIG. 4 is a cross-sectional view of a sensor package 100C according to an example embodiment.

Referring to FIG. 4, the sensor package 100C according to an example embodiment may have the same features as similar features to those of the sensor packages 100A and 100B illustrated in FIGS. 1A and 1B and FIG. 3, except that an encapsulant 130 covers a portion of a lower surface of an image sensor 110. For example, in the present embodiment, the encapsulant 130 may cover the lower surface of the image sensor 110 or a corner portion of a second surface 111S2 of a body layer 111. According to the present embodiment, the encapsulant 130 may extend from a side surface of the image sensor 110 to the lower surface of the image sensor and cover regions of the optical filter 120 and the image sensor 110 may extend, so that a reliability improvement effect may be further improved. In this case, an end 130T (e.g., bottom) of the encapsulant 130 may be disposed on a level higher than a level of an end 150T (e.g., bottom) of a connection bump 150, but example embodiments are not limited thereto.

Figure 5A:
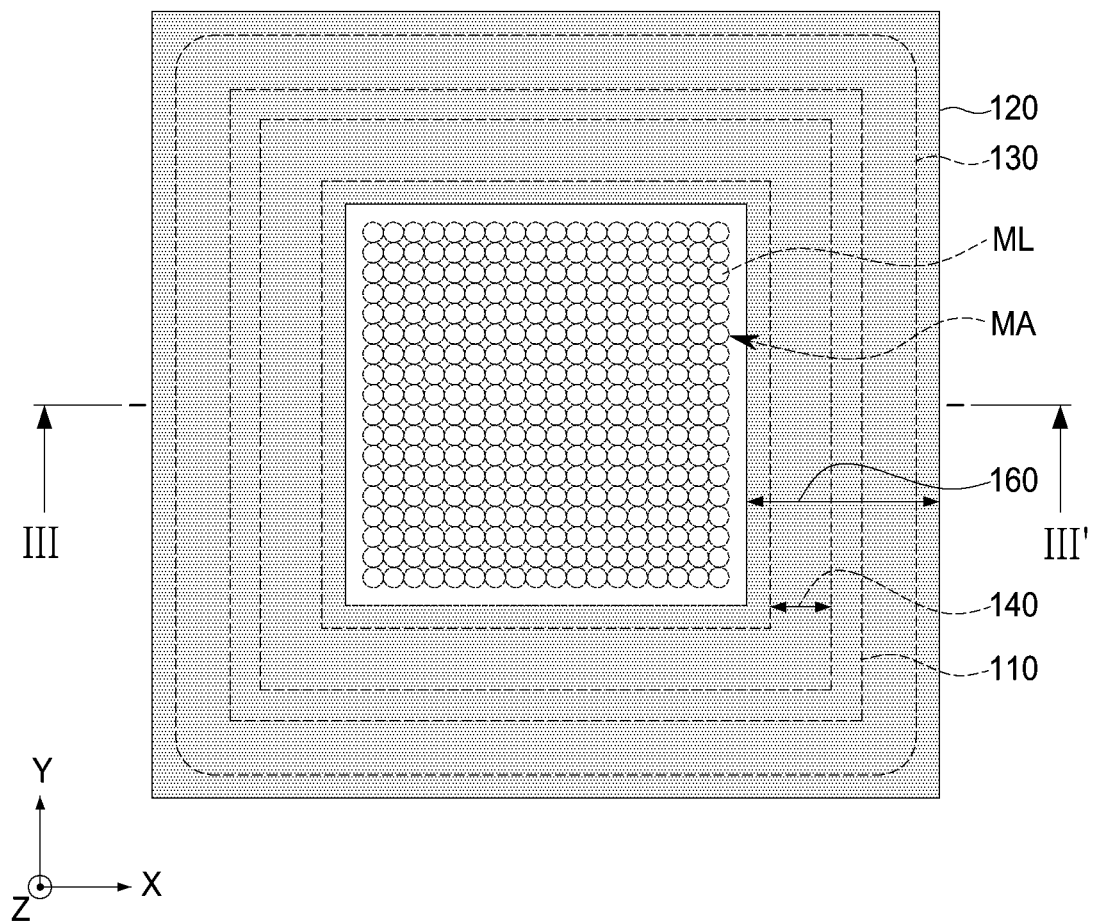
FIG. 5A is a plan view of a sensor package according to an example embodiment.
Figure 5B:
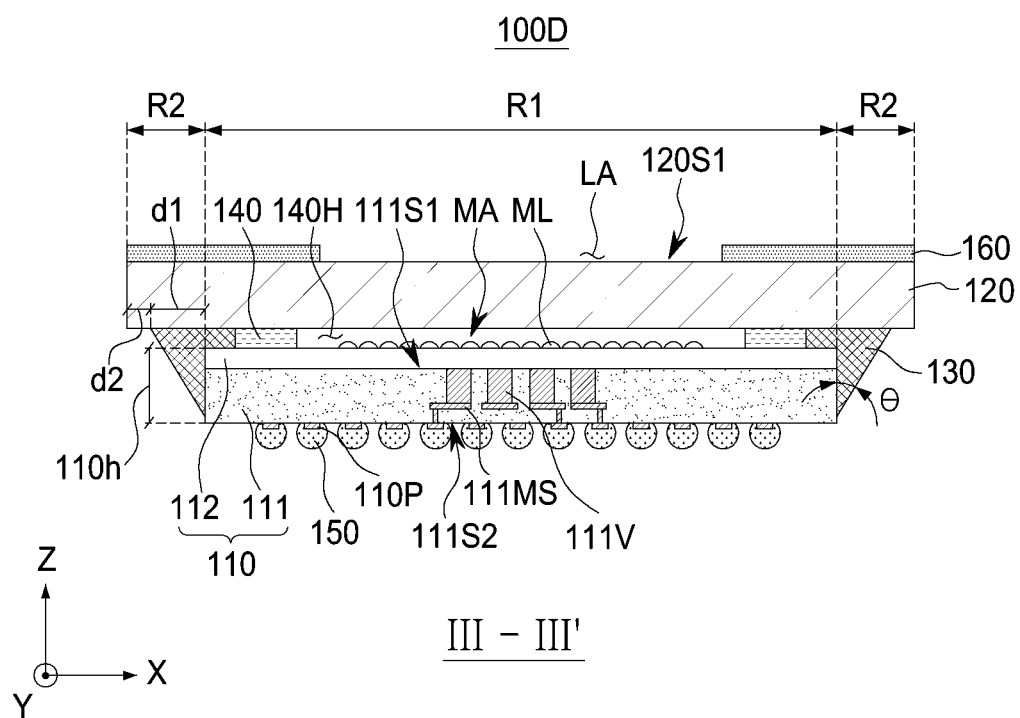
FIG. 5B is a cross-sectional view taken along line III-III' of FIG. 5A.

FIG. 5A is a plan view of a sensor package 100D according to an example embodiment, and FIG. 5B is a cross-sectional view taken along line of FIG. 5A.

Referring to FIGS. 5A and 5B, the sensor package 100D according to an embodiment may have the same features as similar features to those of the sensor packages 100A, 100B, and 100C illustrated in FIGS. 1A and 1B, FIG. 3, and FIG. 4, except that a light blocking layer 160 is further provided on an upper surface 120S1 of an optical filter 120 to define a light incident area LA. For example, the light blocking layer 160 may be provided on the upper surface 120S1 of the optical filter 120 to define the light incident area LA, and may be disposed such that a microlens array MA on the image sensor 110 overlaps the light incident area LA in a first direction (a Z-axis direction). The light blocking layer 160 may block light transmission to the other portion of the optical filter 120, except for a portion of the optical filter 120 exposed through the light incident area LA. The light blocking layer 160 may have a predetermined color (for example, a black color). A thickness of the light blocking layer 160 is not limited to a particular thickness, and may be appropriately designed in consideration of light transmissivity and the like. The light blocking layer 160 may be formed of an insulative material or a conductive material, having an opaqueness or colored with an opaque color to block light. For example, the light blocking layer 160 may include an epoxy resin, and a toning agent, a colorant, a pigment, or the like, representing a predetermined color in the epoxy resin.

Figure 6:
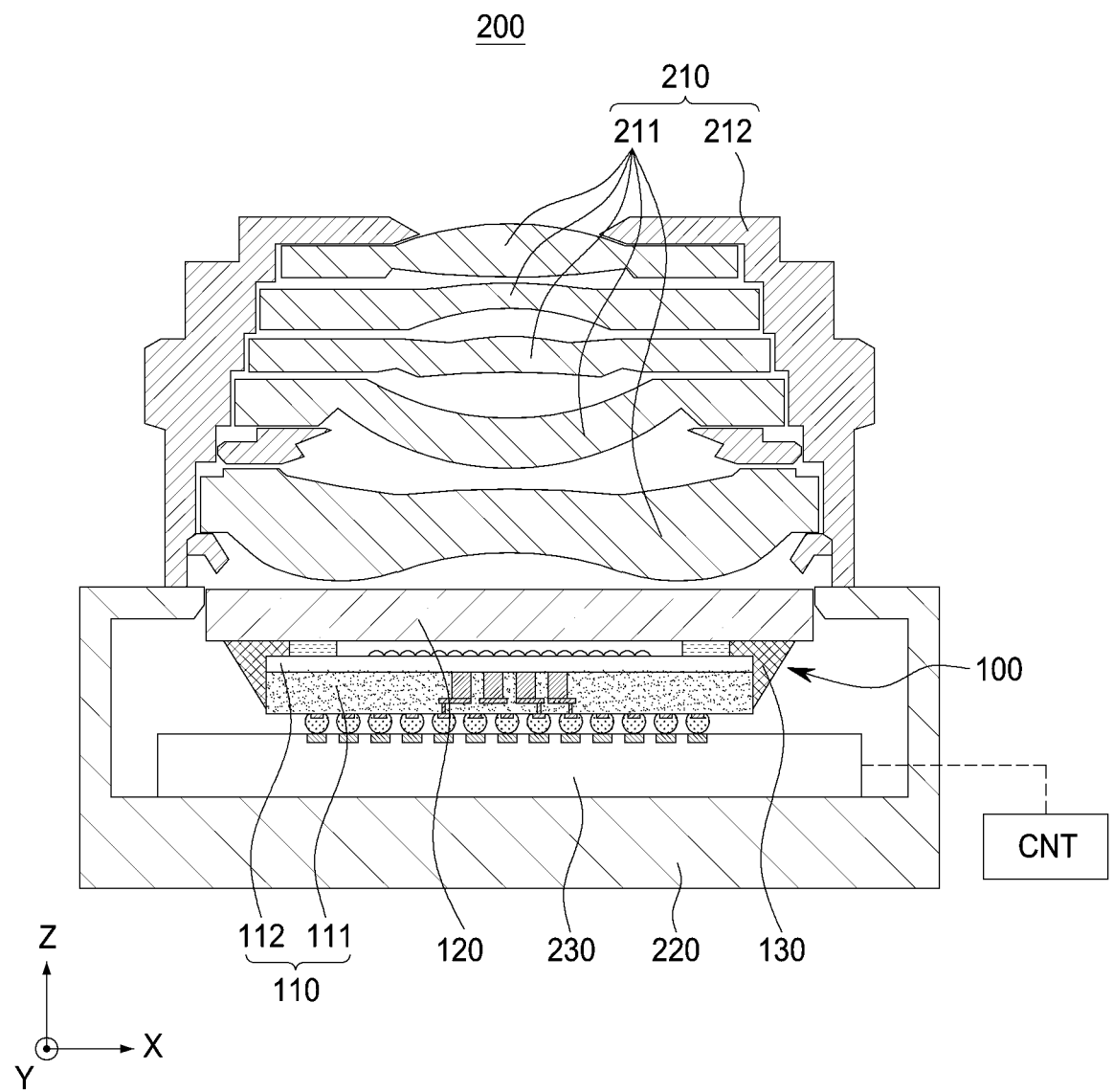
FIG. 6 is a cross-sectional view of an image sensor module to which a sensor package according to an example embodiment is applied.

FIG. 6 is a cross-sectional view of an image sensor module 200 to which a sensor package 100 according to an example embodiment is applied.

Referring to FIG. 6, an image sensor module 200 according to an example embodiment may include an optical module 210, a housing 220, an interconnection substrate 230, and a sensor package 100 mounted on the interconnection substrate 230. The sensor package 100 may include the sensor packages 100A, 100B, 100C, and 100D described with reference to FIGS. 1A to 5B and combinations thereof, and/or sensor packages according to modified embodiments.

The optical module 210 may be disposed on an optical path to allow light, incident in one direction (for example, a Z-axis direction), to be incident on the image sensor 110. The optical module 210 may include a lens assembly 211 and a lens housing 212. The lens assembly 211 may include at least one lens. For example, the lens assembly 211 may include a plurality of lenses arranged in a vertical direction (the Z-axis direction). The lens housing 212 may accommodate and support the lens assembly 211. The lens housing 212 may include a holder portion, supporting the lens assembly 211, and a driving portion (not illustrated) driving the lens assembly 211 in an optical axis direction (for example, the Z-axis direction).

The housing 220 may provide a space, in which the interconnection substrate 230 and the sensor package 100 are accommodated, and/or a mounting space of the optical module 210. The housing 220 may be formed using a polymer material, but an example of a material of the housing 220 is not limited thereto. The interconnection substrate 230 may include a flexible substrate, a rigid substrate, and a flexible-rigid substrate. The interconnection substrate 230 may be electrically connected to a connector CNT outside the housing 220. The sensor package 100 may be electrically connected to another electronic device through the interconnection substrate 230 and the connector CNT.

FIGS. 7A to 7E are cross-sectional views illustrating a process flow of manufacturing the sensor package 100D of FIGS. 5A and 5B.

Figure 7A:
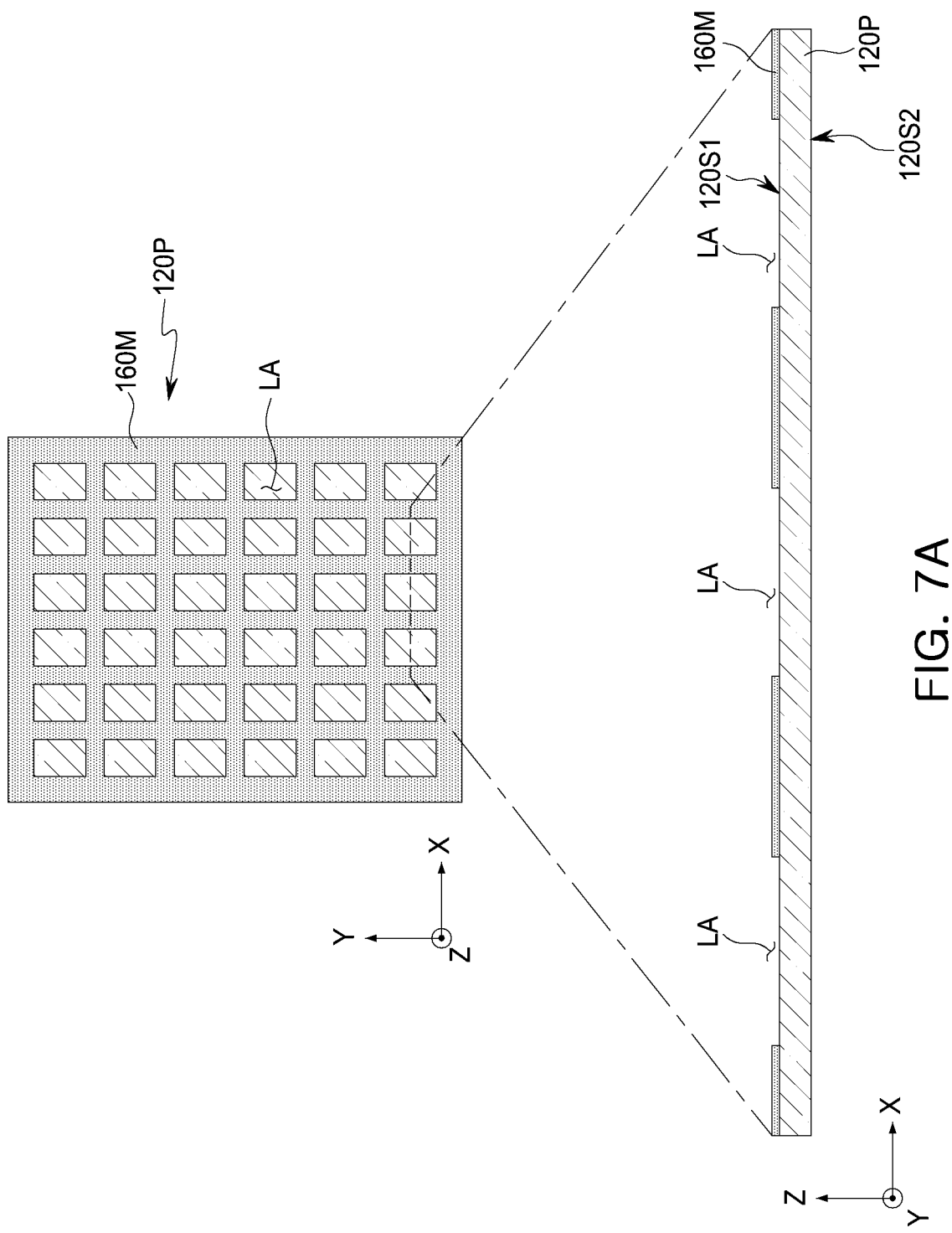
FIGS. 7A to 7E are cross-sectional views illustrating a process flow of manufacturing the sensor package of FIGS. 5A and 5B.

Referring to FIG. 7A, the process flow may start with an operation of preparing an optical filter substrate 120P, having a first surface 120S1 and a second surface 120S2 opposing the first surface 120S1, to which a light blocking mask 160M is attached to define a plurality of light incident areas LA on the first surface 120S1. In an example, the light blocking mask 160M may include an aligning key. The optical filter substrate 120P may be a glass substrate transparent to light in a specific wavelength band. For example, the optical filter substrate 120P may be a blue glass filter configured to filter infrared or near-infrared rays and to transmit light in a visible ray region. The optical filter substrate 120P may have a rectangular plate shape, and each of the plurality of light incident areas LA may also have a rectangular planar shape. According to the present disclosure, a strip-level package process using the optical filter substrate 120P as a base substrate may be introduced to secure stability of a dicing process and to sufficiently secure a contact area between an encapsulant (130 of FIG. 7E) and an optical filter (120 of FIG. 7E) after the dicing process. As compared with the strip-level package process, in a wafer-level package process using an image sensor wafer as a base substrate, cracking may occur in a wafer edge portion in a wafer debonding process and an encapsulant (130 of FIG. 8B) may be peeled off in a dicing process (which will be described later with reference to FIGS. 8A and 8B). The present disclosure may provide a sensor package preventing issues, which may occur in a wafer-level package process, and having further improved reliability.

Figure 7B:
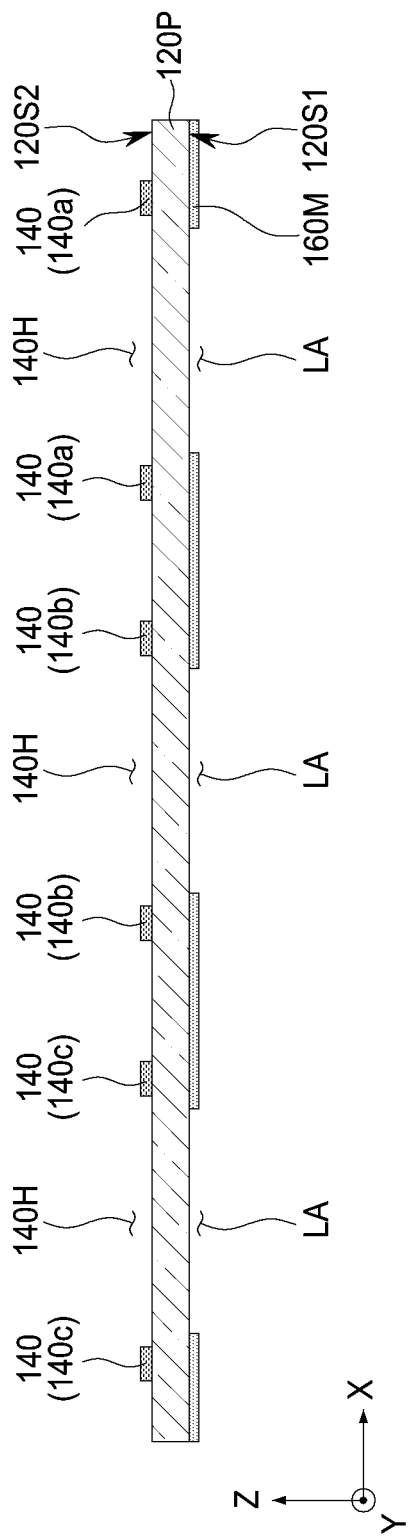

Referring to FIG. 7B, a plurality of support structures 140 having an opening 140H corresponding to one of the plurality of light incident areas LA may be formed on the second surface 120S2 of the optical filter substrate 120P. The plurality of support structures 140 may be formed to surround the corresponding light incident area LA, respectively. For example, the support structures 140 illustrated in the drawings may be divided into a first support structure 140a, a second support structure 140b, and a third support structure 140c, each including an opening 140H. The support structure 140 may include a polymer material, for example, an epoxy-based resin, a siloxane-based resin, or the like. The support structure 140 may be formed by laminating a high-viscosity liquid-type or film-type preliminary material and patterning the laminated preliminary material. The support structure 140 may be patterned using, for example, tetramethylammonium hydroxide (TMAH), propylene glycol monomethyl ether acetate (PGMEA), or the like, as a developer.

Figure 7C:
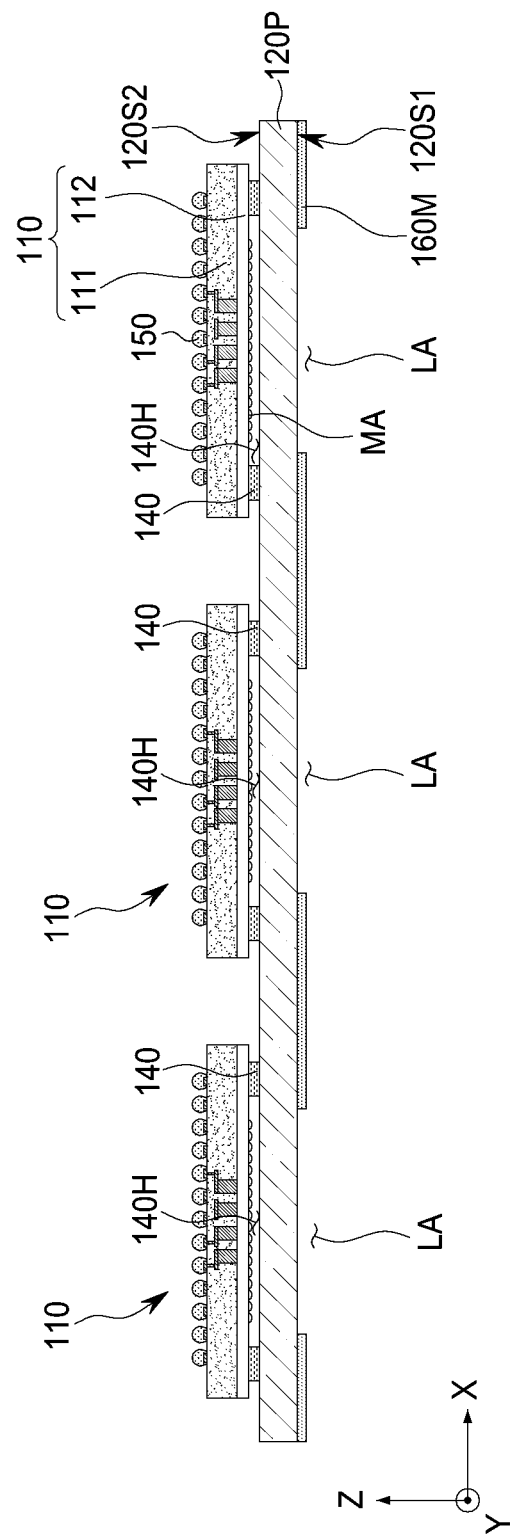

Referring to FIG. 7C, an image sensor 110 may be disposed on the second surface 120S2 of the optical filter substrate 120P. The image sensor 110 may be disposed such that the pixel layer 112 faces the optical filter substrate 120P. For example, the image sensor 110 may be disposed such that a microlens array MA is accommodated in the opening 140H of the support structure 140. In this case, the microlens array MA may be aligned to overlap the light incident area LA in a vertical direction (a Z-axis direction). The image sensor 110 may be disposed on the support structure 140 with a connection bump 150 attached thereto, but example embodiments are not limited thereto.

Figure 7D:
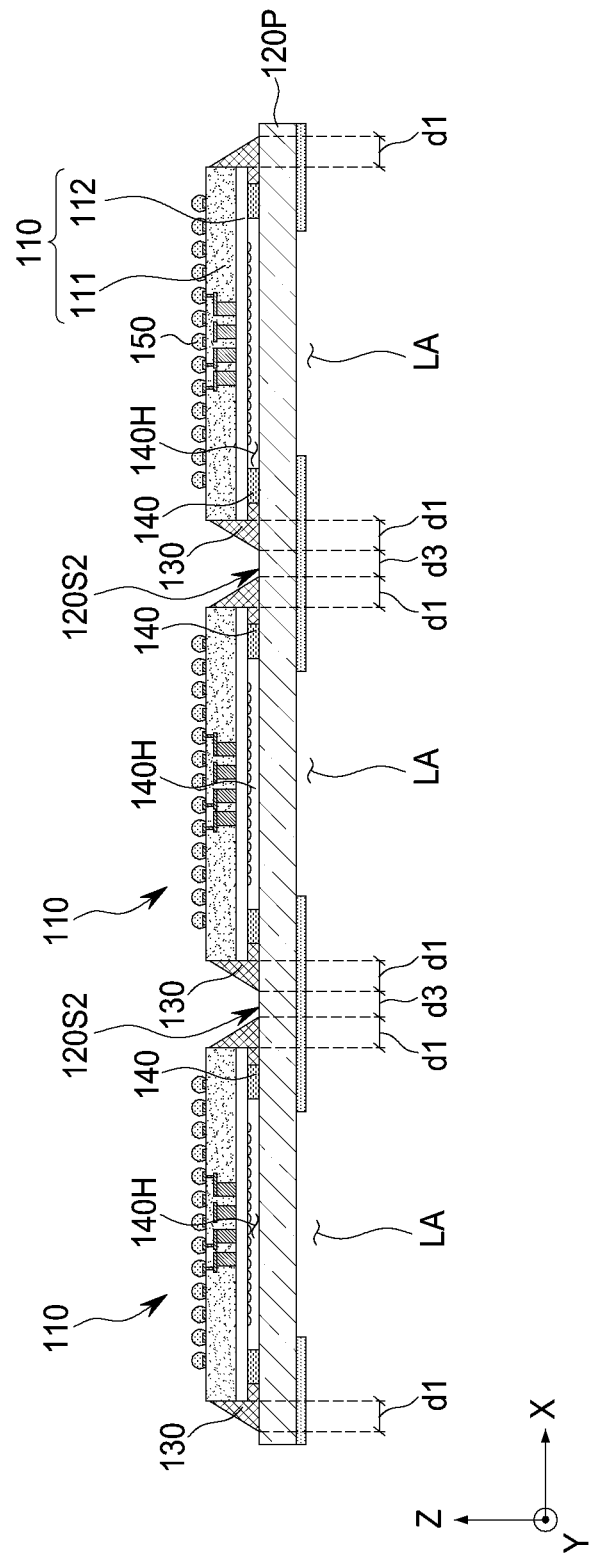

Referring to FIG. 7D, an encapsulant 130 may be formed by applying an encapsulant resin (insulating resin) to a periphery of the image sensor 110. The encapsulant 130 may be formed to surround a side surface of the image sensor 110 and a side surface of each of the plurality of support structures 140 and to be in contact with at least a portion of the second surface 120S2 of the optical filter substrate 120P. The encapsulant 130 may be formed to expose at least a portion of the second surface 120S2 of the optical filter substrate 120P in a location overlapping the light blocking mask 160M in a vertical direction (a Z-axis direction). As shown, a plurality of image sensors 110 may be disposed on a plurality of support structures formed on the optical filter substrate 120P, for example, in a grid-like manner. For example, encapsulants 130 may be disposed to be spaced apart from each other by a predetermined distance d3 along the second surface 120S2 on the optical filter substrate 120P. The second surface 120S2 exposed from the encapsulants 130 may provide a dicing region or a sawing region.

The encapsulant 130 may be formed to be in contact with the second surface 120S2 by a predetermined distance d1 or more in a horizontal direction (for example, an X-axis direction). As an example, when a thickness of the image sensor 110 is about 100 μm, the predetermined distance d1 may be about 300 μm or more. As described above, according to the present disclosure, a strip-level package process (also described as a filter-level package process) may be introduced, so that a cover region of the optical filter substrate 120P and the encapsulant 130 may be secured to effectively suppress damage caused by expansion of air in the opening 140H at a high temperature.

Figure 7E:
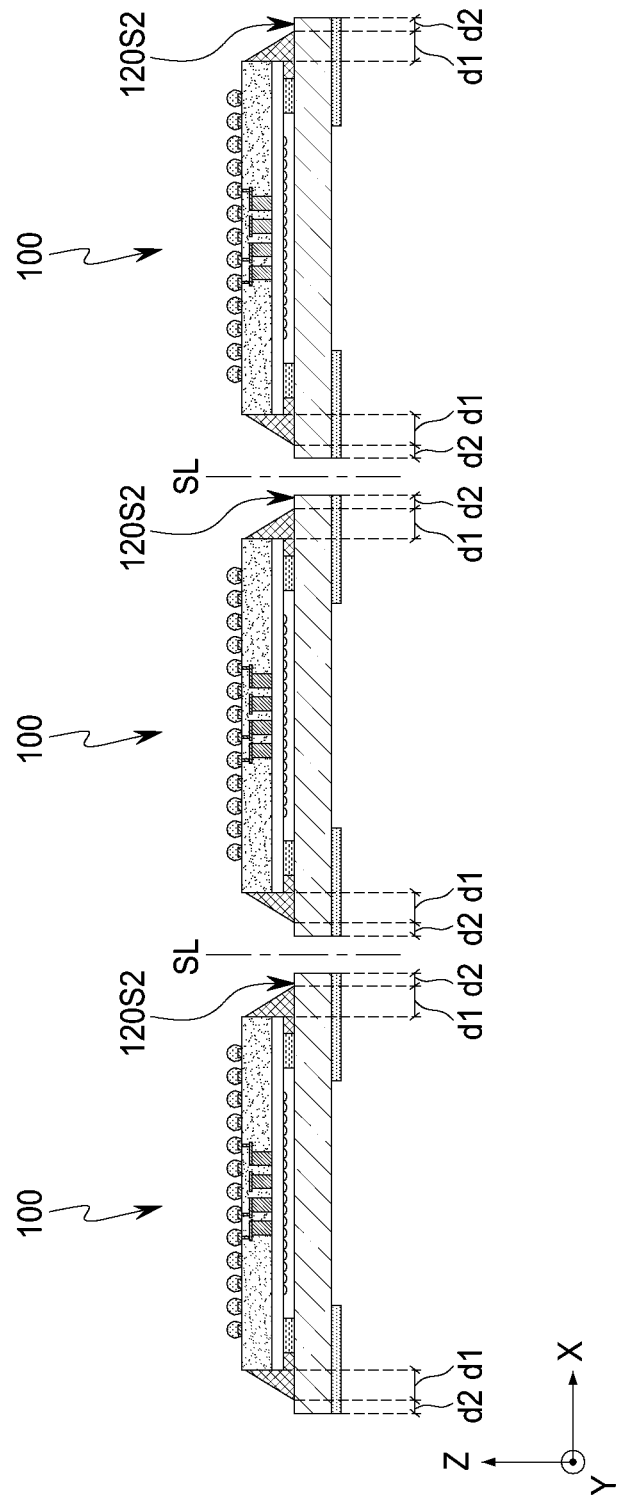

Referring to FIG. 7E, an optical filter substrate (120P of FIG. 7D) may be cut along the second surface 120S2, exposed from the encapsulant 130, to separate the plurality of sensor packages 100 from each other. The optical filter substrate (120P of FIG. 7D) may be cut along a sawing line SL, and a portion of the optical filter substrate (120P of FIG. 7D) may be removed during the cutting process. Accordingly, a separation distance d2 between a cut surface of the optical filter 120 or the optical filter substrate (120P of FIG. 7D) and the encapsulant 130 may be smaller than a separation distance d3 between the encapsulants 130 of FIG. 7D. In FIG. 7D, the separation distance d3 between the encapsulants 130 may be determined in consideration of a minimum separation distance for preventing the encapsulants 130 from being peeled off in the dicing process and the number of sensor packages 100 separated from each other after the dicing process. For example, the separation distance d2 between a corner of the optical filter 120 and the encapsulant 130 may be within a range of about 5 μm to about 15 μm.

As described above, according to the present disclosure, a strip-level package process using the optical filter substrate 120P as a base substrate may be introduce to secure stability of the dicing process and to sufficiently secure a contact area between the encapsulant 130 and the optical filter 120. Hereinafter, advantages of the strip-level package process, as compared to the wafer-level package process, will be described with reference to FIGS. 8A and 8B together.

Figure 8A:
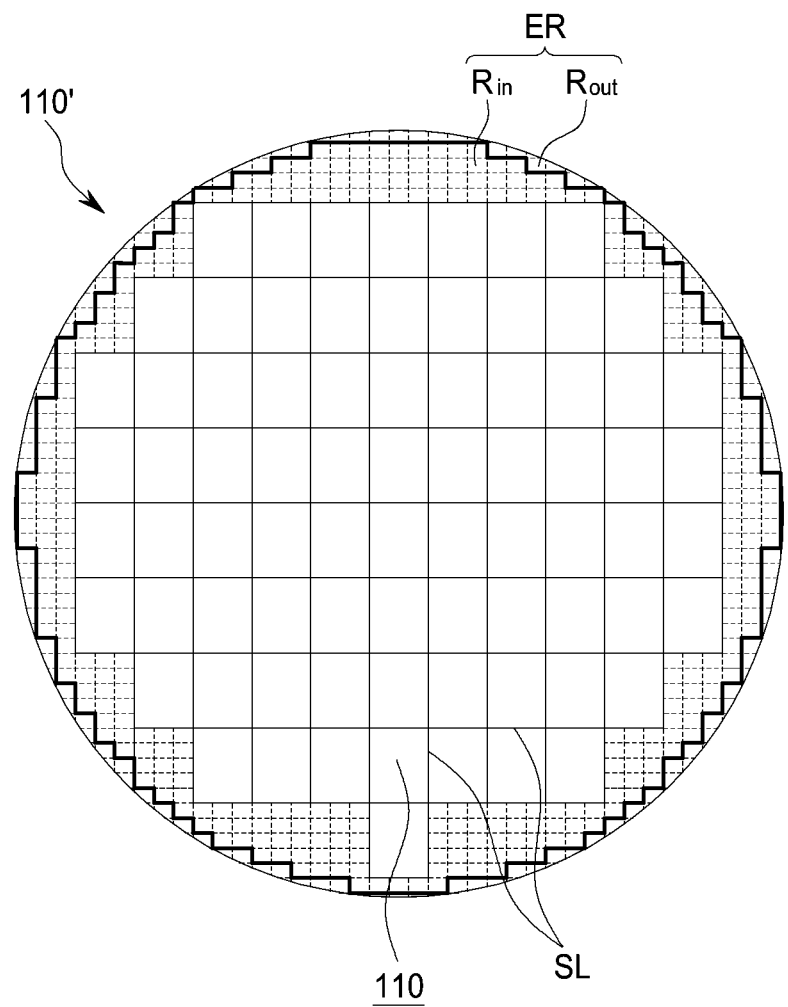
FIGS. 8A and 8B are a plan view and a cross-sectional view illustrating a difference between a wafer-level package process and the process flow described with reference to FIGS. 7A to 7E, respectively.
Figure 8B:
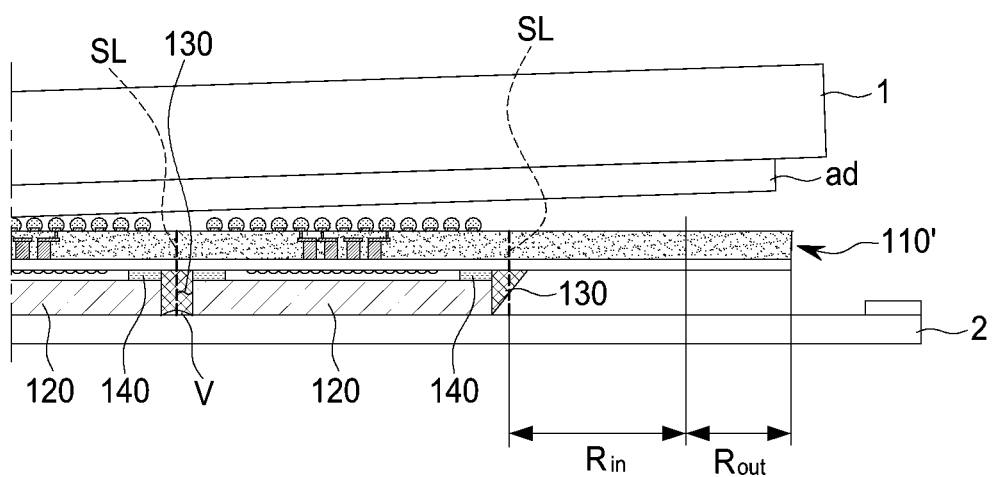

FIGS. 8A and 8B are a plan view and a cross-sectional view illustrating a difference between a wafer-level package process and the process flow described with reference to FIGS. 7A to 7E, respectively.

Referring to FIGS. 8A and 8B together with FIGS. 7A to 7E, in a wafer-level package process, an optical filter 120, an encapsulant 130, and the like, may be sequentially formed on the image sensor wafer 110' using a pre-diced image sensor wafer 110' as a base substrate. The image sensor wafer 110' may include a plurality of image sensors 110 separated by sawing lines SL. The image sensor wafer 110' may be disposed around the plurality of image sensors 110, and may include an edge region ER in which a pixel circuit is not formed or the optical filter 120 is not disposed. The edge region ER may be divided into an outer region Rout, adjacent to a corner thereof, and an inner region Rin adjacent to a center thereof.

When the image sensor wafer 110' is debonded from a first carrier 1, cracking may occur in the edge region ER, in particular, the outer region Rout. For example, when the first carrier 1 is debonded to transfer the image sensor wafer 110' to the second carrier 2 (for example, a dicing tape), cracking may occur in the edge region ER. Since the optical filter substrate 120P does not include an empty region in which the image sensor 110 is not disposed, occurrence of cracking in the edge portion may be suppressed during transferring of the optical filter substrate 120P to the dicing tape.

In addition, in the wafer-level package process, since the image sensor wafer 110' and the encapsulant 130 are cut together in a dicing process, defects such as peeling-off of the encapsulant 130 may occur. As an example, when a void V is formed between the encapsulant 130 and the second carrier 2, chips may fly off during the dicing process. According to the present disclosure, since a top and a bottom of the optical filter substrate 120P are not reversed in the dicing process, a risk of chip fly-off may be reduced. Moreover, since a dicing region (d3 of FIG. 7D) exposed from the encapsulant 130 is provided on a surface of the optical filter substrate 120P, peeling-off of the encapsulant 130 may be prevented.

As described above, according to the method of manufacturing a sensor package according to an example embodiment, issues such as peeling-off of the encapsulant 130, which may occur during a process, may be prevented to increase yield. As a result, a sensor package 100 having improved reliability may be provided.

As described above, according to example embodiments, a contact area between an encapsulant and an optical filter may be secured, and thus, a sensor package having improved reliability may be provided.

While example embodiments have been shown and described above, it will be apparent to those skilled in the art that modifications and variations could be made without departing from the scope of the present invention as defined by the appended claims.

What is claimed is:

1. A sensor package comprising:
   an image sensor including a body layer having an upper surface and a lower surface opposite to the upper surface, a pixel layer disposed on the upper surface, a microlens array disposed on the pixel layer, a connection terminal disposed on the lower surface, and a through-via extending between the upper surface and the lower surface and electrically connected to the connection terminal;
   a support structure disposed on the pixel layer and having an opening in which the microlens array is accommodated;
   an optical filter disposed on the support structure and having a first region, overlapping the image sensor in a first direction, and a second region extending from the first region in a second direction, perpendicular to the first direction, and not overlapping the image sensor in the first direction;
   an encapsulant surrounding a side surface of the image sensor and a side surface of the support structure and covering and contacting a portion of a lower surface of the optical filter in the second region; and
   a connection bump disposed on the connection terminal of the image sensor,
   wherein in the second direction, a first distance along a boundary where the lower surface of the optical filter at the second region contacts the encapsulant is greater than a second distance of a lower surface of the optical filter at the second region exposed from the encapsulant.

2. The sensor package of claim 1, wherein the second distance is within a range of about 5 μm to about 15 μm.

3. The sensor package of claim 1, wherein a side surface of the optical filter does not contact the encapsulant.

4. The sensor package of claim 1, wherein the encapsulant has a shape in which at least a portion of a side surface of the encapsulant extends at a predetermined angle greater than 0 degrees with respect to a side surface of the image sensor.

5. The sensor package of claim 4, wherein the predetermined angle is less than 90 degrees.

6. The sensor package of claim 1, wherein the optical filter is configured to filter light in a specific wavelength band from light incident on the image sensor.

7. The sensor package of claim 6, wherein the optical filter is configured to transmit light in a visible ray region.

8. The sensor package of claim 1, further comprising:
   a light blocking layer disposed on an upper surface of the optical filter to define a light incident area.

9. The sensor package of claim 8, wherein the microlens array is disposed to overlap the light incident area in the first direction.

10. The sensor package of claim 1, wherein the pixel layer has a plurality of unit pixels, the plurality of unit pixels includes a plurality of photodiodes disposed below the microlens array, a plurality of devices disposed below the plurality of photodiodes, and interconnection patterns electrically connected to the plurality of devices.

11. The sensor package of claim 10, wherein the through-via is electrically connected to one of the interconnection patterns and is configured to receive a pixel signal from one of the plurality of unit pixels.

12. The sensor package of claim 1, wherein the support structure surrounds a periphery of the microlens array.

13. A sensor package comprising:
   an image sensor including a body layer having an upper surface and a lower surface opposite to the upper surface, a pixel layer disposed on the upper surface, a microlens array disposed on the pixel layer, a connection terminal disposed on the lower surface, and a through-via extending between the upper surface and the lower surface and electrically connected to the connection terminal;
   an optical filter disposed on the pixel layer and having a first region, overlapping the image sensor in a first direction, and a second region extending from the first region in a second direction, perpendicular to the first direction, and not overlapping the image sensor in the first direction;
   a support structure disposed between the image sensor and the optical filter; and
   an encapsulant extending from a side surface of the image sensor to be inclined to a lower surface of the optical filter and covering at least a portion of each of the side surface of the image sensor and a lower surface of the optical filter,
   wherein the optical filter is electrically insulated from the image sensor.

14. The sensor package of claim 13, wherein the encapsulant covers at least a portion of the second region of the optical filter.

15. The sensor package of claim 14, wherein a contact distance along a boundary between the encapsulant and the second region in the second direction is about 300 μm or more.

16. The sensor package of claim 13, wherein the encapsulant is spaced apart from an edge of the optical filter by a predetermined distance.

17. The sensor package of claim 16, wherein the predetermined distance is within a range of about 5 μm to about 15 μm.

18. A sensor package comprising:
- an image sensor having an upper surface, on which a microlens array is disposed, and a lower surface on which a connection terminal is disposed;
- an optical filter disposed on the upper surface of the image sensor and having a first region, overlapping the image sensor in a first direction, and a second region extending from the first region in a second direction, perpendicular to the first direction, and not overlapping the image sensor in the first direction; and
- an encapsulant covering a side surface of the image sensor and a lower surface of optical filter at the second region,
- wherein a ratio of a contact distance along a boundary between the encapsulant and the lower surface of the optical filter at the second region in the second direction to a maximum width of the image sensor in the second direction is about 0.04:1 or more.

19. The sensor package of claim 18, wherein a ratio of the contact distance to a thickness of the image sensor in the first direction is about 3:1 or more.

20. The sensor package of claim 18, further comprising:
- a support structure disposed between the optical filter and the image sensor,
- wherein the microlens array is blocked from the encapsulant by the support structure.

* * * * *